(12) United States Patent
Choe

(10) Patent No.: US 6,972,605 B1
(45) Date of Patent: Dec. 6, 2005

(54) HIGH SPEED SEMI-DYNAMIC FLIP-FLOP CIRCUIT

(75) Inventor: Swee Yew Choe, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/811,436

(22) Filed: Mar. 25, 2004

(51) Int. Cl.7 ............................ H03K 3/037; H03K 3/12
(52) U.S. Cl. ................ 327/200; 327/199; 327/210; 327/211
(58) Field of Search ................... 327/199–203, 327/208, 210, 211, 212, 214, 215, 218, 219, 327/223, 225; 326/95, 97, 98

(56) References Cited

U.S. PATENT DOCUMENTS

| 5,898,330 A * | 4/1999 | Klass | 327/210 |
| 5,917,355 A * | 6/1999 | Klass | 327/208 |
| 6,265,923 B1 * | 7/2001 | Amir et al. | 327/218 |
| 6,646,487 B2 * | 11/2003 | Nedovic et al. | 327/211 |

* cited by examiner

Primary Examiner—Long Nguyen
(74) Attorney, Agent, or Firm—Gunnison, McKay & Hodgson, L.L.P.; Philip J. McKay

(57) ABSTRACT

A high-speed semi-dynamic flip-flop circuit uses a keeper transistor to replace the back-to-back inverter keeper circuit of prior art semi-dynamic flip-flop circuits to avoid the fight between a first node, or OUTBAR node, and the prior art back-to-back inverter keeper circuit. The result is a faster semi-dynamic flip-flop circuit that is also immune to noise.

12 Claims, 2 Drawing Sheets

HIGH SPEED SEMI-DYNAMIC FLIP-FLOP CIRCUIT

FIELD OF THE INVENTION

The present invention relates generally to logic circuits and, more particularly, to semi-dynamic flip-flop circuits.

BACKGROUND OF THE INVENTION

FIG. 1 shows a schematic diagram of one embodiment of a typical prior art semi-dynamic flip-flop circuit 100. As seen in FIG. 1, semi-dynamic flip-flop circuit 100 included a first supply voltage 101, typically Vdd, a back-to-back inverter keeper circuit 103 and an NMOS stack 105 including NMOS transistors N1, N2 and N3, coupled to a second supply voltage 107, typically ground.

Semi-dynamic flip-flop circuit 100 had two modes, or phases, of operation; a pre-charge phase and an evaluation phase. In one embodiment of prior art semi-dynamic flip-flop circuit 100, in the pre-charge phase; the signal CLK 109 was low or a digital "0" and a first node 190 was high, or a digital "1".

In the following discussion, assume that in the previous cycle, there was a path 191 from first node 190 to second supply voltage 107 through NMOS stack 105. In the evaluation phase, the signal CLK was high or a digital "1", thereby providing first node 190 a path to second supply voltage 107.

Prior art semi-dynamic flip-flop circuit 100 functioned reasonably well in either low speed environments or low noise environments, however, semi-dynamic flip-flop circuit 100 did not perform well in high speed and high noise applications. This was because, with prior art semi-dynamic flip-flop circuit 100, the transition from the pre-charge phase to the evaluation phase involved an inherent problem regarding first node 190, back-to-back inverter keeper circuit 103 and NMOS stack 105.

This problem arose because, in the pre-charge phase, at the transition from pre-charge to evaluation phase, the signal CLK goes to a digital "1" and NFET N1 is turned on, consequently, NMOS stack 105 provided a path 191 from first node 190 (FIG. 1) to second supply voltage 107, typically ground, through NMOS stack 105. Once path 191 was established, first node 190 should have dropped to a digital "0" as rapidly as possible to avoid delays in operation of prior art semi-dynamic flip-flop circuit 100. However, in this same time frame, back-to-back inverter keeper circuit 103 was trying to hold first node 190 at first supply voltage 101, i.e., at a digital "1". Consequently, in semi-dynamic flip-flop circuit 100 there was an inherent "fight" between first node 190, trying to discharge to "0" and back-to-back inverter keeper circuit 103 trying to hold first node 190 at "1" during the transition between pre-charge and evaluation. This fight resulted in a significant delay in the operation of prior art semi-dynamic flip-flop circuit 100.

To try and minimize this effect, i.e., the delay, resulting from the "fight" between first node 190, trying to discharge to "0" and back-to-back inverter keeper circuit 103 trying to hold first node 190 at "1" during the transition between pre-charge and evaluation, a back-to-back inverter keeper circuit 103 with the smallest possible channel dimensions, i.e., the transistors making up back-to-back inverter keeper circuit 103 made intentionally small, could be employed. By this method, back-to-back inverter keeper circuit 103 would hold node 190 high for as short a time as possible. In other words, back-to-back inverter keeper circuit 103 could be made weak and small so it would lose its fight with first node 190 quickly. Unfortunately, this solution has significant drawbacks. In particular, by making back-to-back inverter keeper circuit 103 small, the noise immunity of semi-dynamic flip-flop circuit 100 is compromised and this could lead to total failure of semi-dynamic flip-flop circuit 100 in high noise environments.

As a result of the situation discussed above, designers of semi-dynamic flip-flop circuit 100 were constantly involved in a balancing act between minimizing the size and strength of back-to-back inverter keeper circuit 103, to increase speed of prior art semi-dynamic flip-flop circuit 100, and increasing the size and strength of back-to-back inverter keeper circuit 103, to make semi-dynamic flip-flop circuit 100 more robust and noise immune. The result was that semi-dynamic flip-flop circuit 100 functioned reasonably well in either low speed environments or low noise environments, however, semi-dynamic flip-flop circuit 100 did not perform well in high speed and high noise applications.

What is needed is a method and apparatus for creating an improved semi-dynamic flip-flop circuit that is capable of operation in both high speed and high noise environments.

SUMMARY OF THE INVENTION

The present invention is directed to a method and apparatus for creating an improved semi-dynamic flip-flop circuit that is capable of operation in both high speed and high noise environments.

The high-speed semi-dynamic flip-flop circuit of the invention uses a keeper transistor to replace the back-to-back inverter keeper circuit of the prior art to avoid the fight between the first node and the prior art back-to-back inverter keeper circuit described above.

According to the present invention, in operation, the high-speed semi-dynamic flip-flop circuit has two modes, or phases, of operation; a pre-charge phase and an evaluation phase. In one embodiment of a high-speed semi-dynamic flip-flop circuit of the invention, in the initial pre-charge phase, the CLK signal is low or a digital "0". Consequently, the output on a NAND gate output is high. Consequently, a fourth transistor is in the on, or conducting state, and a second, or keeper, transistor of the invention is in the off, or non-conducting state.

In the evaluation phase, signal CLK is high or a digital "1" and the high speed semi-dynamic flip-flop circuit first node either remains high or it discharges depending on the data at a data input "d". If the high-speed semi-dynamic flip-flop circuit first node discharges, the output of the NAND gate remains high and the fourth transistor-remains on while the second transistor remains off. Consequently, there is no fight during the discharge process since the second transistor is off.

On the other hand, according to the present invention, if the data at data input "d" is low, this causes the high-speed semi-dynamic flip-flop circuit first node to remain high and the output at the NAND gate output switches to a low a predetermined number of gate delays after the signal CLK. According to one embodiment of the present invention, this delay is provided by first and second inverters and ensures that the fourth transistor turns off and the second transistor turns on to reinforce a high on high speed semi-dynamic flip-flop circuit first node.

Since, according to the invention, the keeper transistor does not resist, compete or "fight" the discharge of the first node when there is a path from the first node to the second supply voltage, circuit designers are free to use larger and more powerful second transistors. This, in turn, means that the high-speed semi-dynamic flip-flop circuits of the invention, in contrast to prior art semi-dynamic flip-flop circuits, can be designed to have high noise immunity and increased speed.

In addition, the modification of the invention is space efficient and readily incorporated into existing designs.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1:
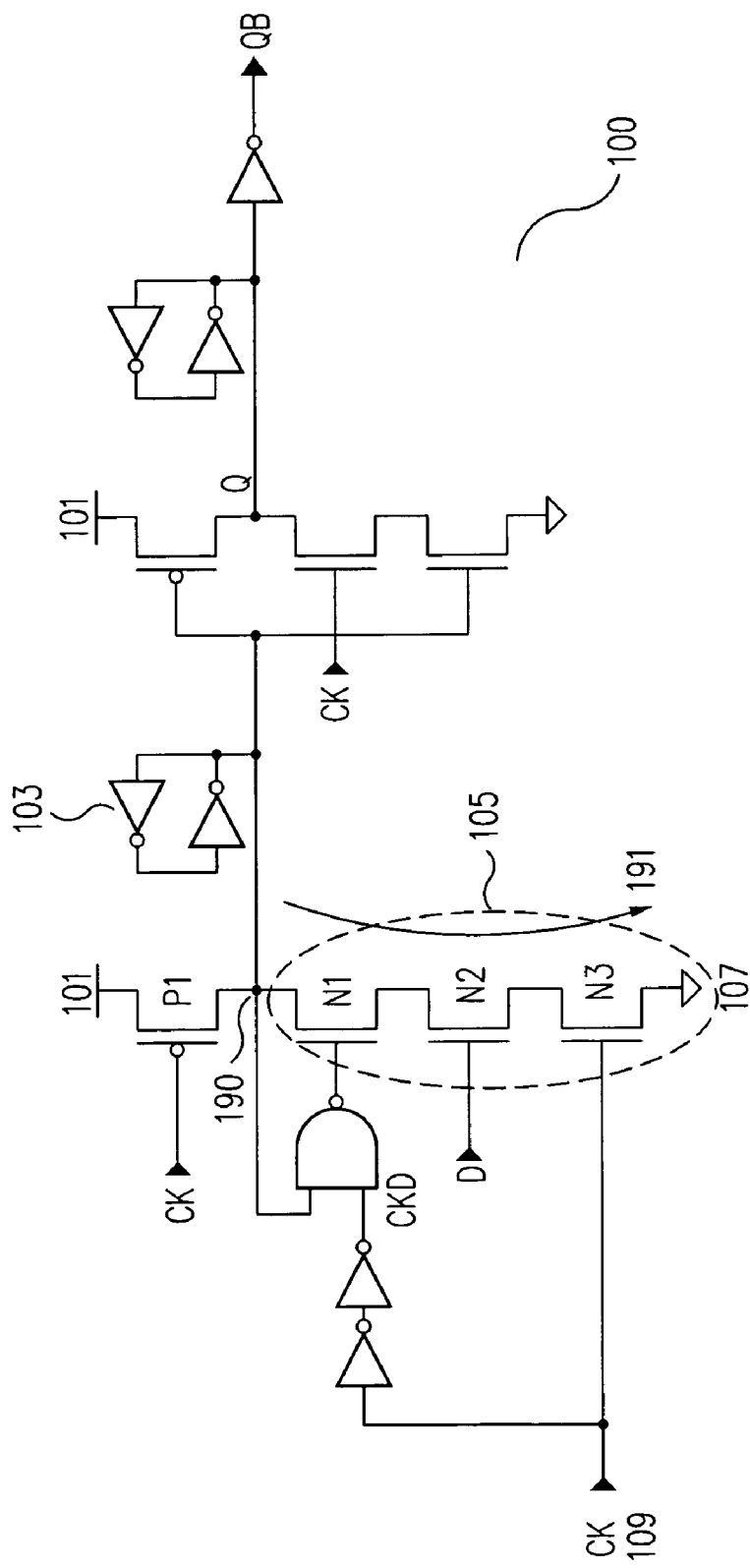
FIG. 1 shows a schematic diagram of a prior art semi-dynamic flip-flop circuit.

The high-speed semi-dynamic flip-flop circuit of the invention (200 in FIG. 2) uses a keeper, transistor (M2 in FIG. 2) to replace the back-to-back inverter keeper circuit of the prior art (103 in FIG. 1) to avoid the fight between the first node (290 in FIG. 2) and the prior art back-to-back inverter keeper circuit described above.

According to the present invention, in operation, the high-speed semi-dynamic flip-flop circuit has two modes, or phases, of operation; a pre-charge phase and an evaluation phase. In one embodiment of a high-speed semi-dynamic flip-flop circuit of the invention, in the initial pre-charge phase, the CLK signal (201 in FIG. 2) is low or a digital "0". Consequently, the output on a NAND gate (217 in FIG. 2) output (219 in FIG. 2) is high and a fourth transistor (M4 in FIG. 2) is in the on, or conducting state, and a second, or keeper, transistor of the invention (M2 in FIG. 2) is in the off, or non-conducting state.

Figure 2:
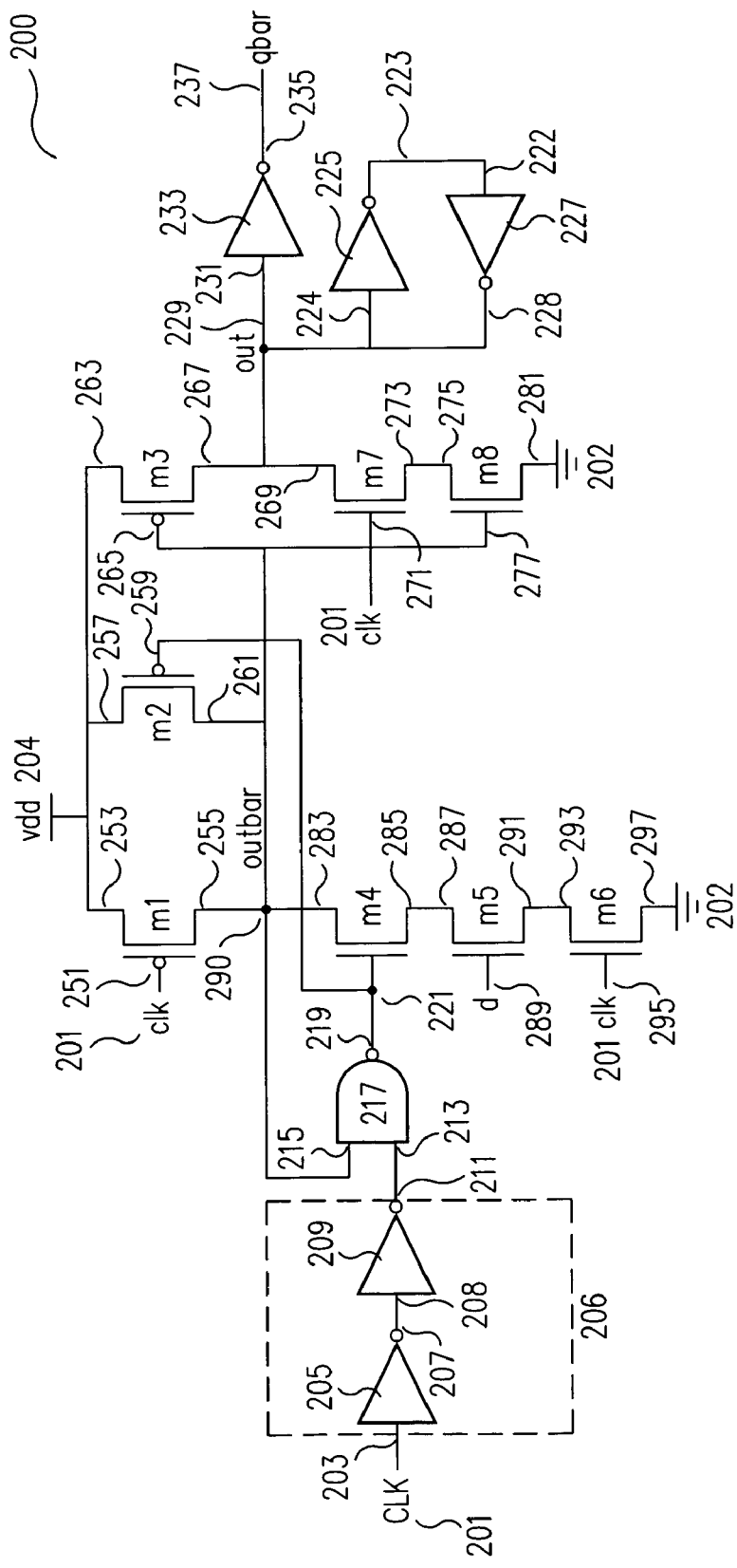
FIG. 2 shows a schematic diagram of one embodiment of a high-speed domino logic designed according to the principles of the present invention.

In the evaluation phase, signal CLK is high or a digital "1" and the high speed semi-dynamic flip-flop circuit first node either remains high or it discharges depending on the data at a data input "d" (289 in FIG. 2). If the high-speed semi-dynamic flip-flop circuit first node discharges, the output of the NAND gate remains high and the fourth transistor remains on while the second transistor remains off. Consequently, there is no fight during the discharge process since the second transistor is off.

On the other hand, according to the present invention, if the data at data input "d" is low, this causes the high-speed semi-dynamic flip-flop circuit first node to remain high and the output at the NAND gate output switches to a low a predetermined number of gate delays after the signal CLK. According to one embodiment of the present invention, this delay is provided by first and second inverters (205 and 209 in FIG. 2) and ensures that the fourth transistor turns off and the second transistor turns on to reinforce a high on high speed semi-dynamic flip-flop circuit first node.

Since, according to the invention, the keeper transistor does not resist, compete or "fight" the discharge of the first node when there is a path from the first node to the second supply voltage, circuit designers are free to use larger and more powerful second transistors. This, in turn, means that the high-speed semi-dynamic flip-flop circuits of the invention, in contrast to prior art semi-dynamic flip-flop circuits, can be designed to have high noise immunity and increased speed.

In addition, the modification of the invention is space efficient and readily incorporated into existing designs.

FIG. 2 shows a schematic diagram of one embodiment of a high-speed semi-dynamic flip-flop circuit 200 of the invention. As seen in FIG. 2, high speed semi-dynamic flip-flop circuit 200 includes a first supply voltage 204, in one embodiment Vdd, coupled to a first flow electrode 253, of a first transistor M1; a first flow electrode 257 of a second transistor M2; and a first flow electrode 263 of a third transistor M3. The signal CLK 201 is coupled to a control electrode 251 of first transistor M1; a control electrode 295 of a sixth transistor M6; a control electrode 271 of a seventh transistor M7; and an input 203 of a delay circuit 206 consisting, in one embodiment of a first inverter 205 and a second inverter 209.

According to one embodiment of the invention, a second flow electrode 255 of first transistor M1 is coupled to a first node 290, also known as OUTBAR node 290. A second flow electrode 261 of second transistor M2 is also coupled to first node 290. A control electrode 265 of third transistor M3 is coupled to first node 290 and a control electrode 277 of an eighth transistor M8. A second flow electrode 267 of third transistor M3 is coupled to a high-speed semi-dynamic flip-flop circuit OUT terminal 229.

According to one embodiment of the invention, an output 207 of first inverter 205 is coupled to an input 208 of second inverter 209. An output 211 of second inverter 209 is coupled to a first input 213 of NAND gate 217. A second input 215 of NAND gate 217 is coupled to first node 290. According to one embodiment of the invention, an output 219 of NAND gate 217 is coupled to a control electrode 259 of second transistor M2 and a control electrode 221 of a fourth transistor M4.

According to one embodiment of the invention, first flow electrode 283 of fourth transistor M4 is coupled to first node 290. A second flow electrode 285 of fourth transistor M4 is coupled to a first flow electrode 287 of a fifth transistor M5. A second flow electrode 291 of fifth transistor M5 is coupled to a first flow electrode 293 of sixth transistor M6. A second flow electrode 297 of sixth transistor M6 is coupled to a second supply voltage 202, in one embodiment ground.

According to one embodiment of the invention, a control electrode 289 of fifth transistor M5 is coupled to a data input "d" 289.

According to one embodiment of the invention, high-speed semi-dynamic flip-flop circuit OUT terminal 229 is coupled to a first flow electrode 269 of seventh transistor M7. A second flow electrode 273 of seventh transistor M7 is coupled to a first flow electrode 275 of eighth transistor M8. A second flow electrode 281 of eighth transistor M8 is coupled to second supply voltage 202.

According to one embodiment of the invention, high-speed semi-dynamic flip-flop circuit OUT terminal 229 is also coupled to an input 231 of third inverter 233. An output 235 of third inverter 233 is coupled to a high-speed semi-dynamic flip-flop circuit qbar output 237.

According to one embodiment of the invention, high speed semi-dynamic flip-flop circuit OUT terminal 229 is also coupled to an input 224 of a fourth inverter 225 and output 228 of a fifth inverter 227. In addition, output 223 of fourth inverter 225 is coupled to input 222 of fifth inverter 227.

In one embodiment of the invention, first transistor M1, second transistor M2, and third transistor M3 are PFET transistors and fourth transistor M4, fifth transistor M5, sixth transistor M6, seventh transistor M7, and eighth transistor M8 are NFET transistors. In this embodiment of the invention, first supply voltage 204 is Vdd and second supply voltage 202 is ground. However, those of skill in the art will recognize that specific embodiments of high speed semi-dynamic flip-flop circuit 200 are shown in FIG. 2 with specific transistors for illustrative purposes only and that the NFETs and PFETS shown in the FIG. 2 can be readily exchanged for PFETs and NFETs by reversing the polarities of the supply voltages 201 and 206 or by other well known circuit modifications.

In addition, those of skill in the art will readily recognize that the choice of first inverter 205 and second inverter 209 to comprise delay circuit 206 was made arbitrarily and for illustrative purposes only. Any number of inverters, or any form of delay circuitry could be easily used to accomplish the same result.

In operation, high-speed semi-dynamic flip-flop circuit 200 has two modes, or phases, of operation; a pre-charge phase and an evaluation phase. In one embodiment of high-speed semi-dynamic flip-flop circuit 200, in the initial pre-charge phase, the signal CLK 201 is low or a digital "0". Consequently, the output on NAND gate output 219 is high and fourth transistor M4 is in the on, or conducting state, and second transistor M2 is in the off, or non-conducting state.

In the evaluation phase, signal CLK is high or a digital "1" and high speed semi-dynamic flip-flop circuit first node 290 either remains high or it discharges depending on the data at data input "d" 289. If high speed semi-dynamic flip-flop circuit first node 290 discharges, the output 219 of NAND gate 217 remains high and fourth transistor M4 remains on while second transistor M2 remains off. Consequently, there is no fight during the discharge process since second transistor M2 is off.

On the other hand, if the data at data input "d" 289 is low, this causes high-speed semi-dynamic flip-flop circuit first node 290 to remain high and the output at NAND gate output 219 switches to low three gate delays after the signal CLK 201. According to this one embodiment the present invention, this delay is provided by first and second inverters 205 and 209 and ensures that fourth transistor M4 turns off and second transistor M2 turns on to reinforce a high on high speed semi-dynamic flip-flop circuit first node 290.

Those of skill in the art will recognize that the process discussed above will repeat for each switching of the system clock. Those of skill in the art will further recognize that the choice of signal highs and signal lows was made arbitrarily for illustrative purposes only and that at other times, and in other embodiments of the invention, signal highs could be replaced with signal lows and vice-versa.

According to the present invention, in addition to eliminating the fight to facilitate a faster discharge of first node 190, the method and structure of the present invention increases the noise immunity of high-speed semi-dynamic flip-flop circuit 200 by allowing the size of second transistor M2 to be increased without affecting circuit performance. This, in turn, means that the high-speed semi-dynamic flip-flop circuits 200, in contrast to prior art semi-dynamic flip-flop circuits, can be designed to have high noise immunity and increased speed.

As discussed above, the present invention is directed to a method and apparatus for creating a high-speed semi-dynamic flip-flop circuit that is capable of operation in both high speed and high noise environments.

Since, according to the invention, the second, or keeper, transistor does not resist, compete or "fight" the discharge of the first node when there is a path from the first node to the second supply voltage, circuit designers are free to use larger and more powerful second transistors. This, in turn, means that the high-speed semi-dynamic flip-flop circuits of the invention, in contrast to prior art semi-dynamic flip-flop circuits, can be designed to have high noise immunity and increased speed.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

In addition, those of skill in the art will readily recognize that the choice of first inverter 205 and second inverter 209 to comprise delay circuit 206 was made arbitrarily and for illustrative purposes only. Any number of inverters, or any form of delay circuitry could be easily used to accomplish the same result.

Consequently, the scope of the invention is defined by the claims and their equivalents.

What is claimed is:

1. A high speed semi-dynamic flip-flop circuit comprising:
   a first supply voltage;
   a second supply voltage;
   a first clock signal;
   a high-speed semi-dynamic flip-flop circuit first node;
   a high-speed semi-dynamic flip-flop circuit OUT terminal;
   a high-speed semi-dynamic flip-flop circuit data input terminal;
   a high-speed semi-dynamic flip-flop circuit qbar out terminal;
   a first transistor, said first transistor comprising a first transistor first flow electrode, a first transistor second flow electrode and a first transistor control electrode, said first supply voltage being coupled to said first transistor first flow electrode, said first clock signal being coupled to said first transistor control electrode, said first transistor second flow electrode being coupled to said high speed semi-dynamic flip-flop circuit first node;
   a second transistor, said second transistor comprising a second transistor first flow electrode, a second transistor second flow electrode and a second transistor control electrode, said first supply voltage being coupled to said second transistor first flow electrode, said second transistor second flow electrode being coupled to said high speed semi-dynamic flip-flop circuit first node;
   a third transistor, said third transistor comprising a third transistor first flow electrode, a third transistor second flow electrode and a third transistor control electrode, said first supply voltage being coupled to said third transistor first flow electrode, said third transistor control electrode being coupled to said high speed semi-dynamic flip-flop circuit first node, said third transistor second flow electrode being coupled to said high speed semi-dynamic flip-flop circuit OUT terminal;

a delay circuit, comprising a delay circuit input and a delay circuit output, said delay circuit input being coupled to said first clock signal;

a NAND gate, said NAND gate comprising a NAND gate first input, a NAND gate second input, and a NAND gate output, said NAND gate first input being coupled to said delay circuit output, said NAND gate second input being coupled to said high speed semi-dynamic flip-flop circuit first node, said NAND gate output being coupled to said second transistor control electrode;

a fourth transistor, said fourth transistor comprising a fourth transistor first flow electrode, a fourth transistor second flow electrode and a fourth transistor control electrode, said fourth transistor first flow electrode being coupled to said high speed semi-dynamic flip-flop circuit first node, said fourth transistor control electrode being coupled to said NAND gate output;

a fifth transistor, said fifth transistor comprising a fifth transistor first flow electrode, a fifth transistor second flow electrode and a fifth transistor control electrode, said fifth transistor first flow electrode being coupled to said fourth transistor second flow electrode, said fifth transistor control electrode being coupled to said high speed semi-dynamic flip-flop circuit data input terminal;

a sixth transistor, said sixth transistor comprising a sixth transistor first flow electrode, a sixth transistor second flow electrode and a sixth transistor control electrode, said sixth transistor first flow electrode being coupled to said fifth transistor second flow electrode, said sixth transistor control electrode being coupled to said first clock signal, said sixth transistor second flow electrode being coupled to said second supply voltage;

a seventh transistor, said seventh transistor comprising a seventh transistor first flow electrode, a seventh transistor second flow electrode and a seventh transistor control electrode, said seventh transistor first flow electrode being coupled to said high speed semi-dynamic flip-flop circuit OUT terminal, said seventh transistor control electrode control being coupled to said first clock signal;

an eighth transistor, said eighth transistor comprising an eighth transistor first flow electrode, an eighth transistor second flow electrode and an eighth transistor control electrode, said eighth transistor first flow electrode being coupled to said seventh transistor second flow electrode, said eighth transistor control electrode being coupled to said high speed semi-dynamic flip-flop circuit first node, said eighth transistor second flow electrode being coupled to said second supply voltage;

a third inverter, said third inverter comprising a third inverter input and a third inverter output, said third inverter input being coupled to said high speed semi-dynamic flip-flop circuit OUT terminal, said third inverter output being coupled to said high speed semi-dynamic flip-flop circuit qbar out terminal;

a fourth inverter, said fourth inverter comprising a fourth inverter input and a fourth inverter output, said fourth inverter input being coupled to said high speed semi-dynamic flip-flop circuit OUT terminal; and a fifth inverter, said fifth inverter comprising a fifth inverter input and a fifth inverter output, said fifth inverter input being coupled to said fourth inverter output, said fifth inverter output being coupled to said high speed semi-dynamic flip-flop circuit OUT terminal.

2. The high speed semi-dynamic flip-flop circuit of claim 1, wherein,
said delay circuit comprises:
a first inverter, said first inverter comprising a first inverter input and a first inverter output, said first inverter input being coupled to said delay circuit input;
a second inverter, said second inverter comprising a second inverter input and a second inverter output, said second inverter input being coupled to said first inverter output, said second inverter output being coupled to said delay circuit output.

3. The high speed semi-dynamic flip-flop circuit of claim 2, wherein,
Said first supply voltage is Vdd and said second supply voltage is ground.

4. The high speed semi-dynamic flip-flop circuit of claim 3, wherein,
said first, second and third transistors are PFET transistors.

5. The high speed semi-dynamic flip-flop circuit of claim 3, wherein,
said fourth, fifth, sixth, seventh and eighth transistors are NFET transistors.

6. A high speed semi-dynamic flip-flop circuit comprising:
a first supply voltage, Vdd;
a second supply voltage, ground;
a first clock signal;
a high-speed semi-dynamic flip-flop circuit first node;
a high-speed semi-dynamic flip-flop circuit OUT terminal;
a high-speed semi-dynamic flip-flop circuit data input terminal;
a high-speed semi-dynamic flip-flop circuit qbar out terminal;
a first transistor, said first transistor being a PFET transistor and comprising a first transistor first flow electrode, a first transistor second flow electrode and a first transistor control electrode, said first supply voltage being coupled to said first transistor first flow electrode, said first clock signal being coupled to said first transistor control electrode, said first transistor second flow electrode being coupled to said high speed semi-dynamic flip-flop circuit first node;
a second transistor, said second transistor being a PFET transistor and comprising a second transistor first flow electrode, a second transistor second flow electrode and a second transistor control electrode, said first supply voltage being coupled to said second transistor first flow electrode, said second transistor second flow electrode being coupled to said high speed semi-dynamic flip-flop circuit first node;
a third transistor, said third transistor being a PFET transistor and comprising a third transistor first flow electrode, a third transistor second flow electrode and a third transistor control electrode, said first supply voltage being coupled to said third transistor first flow electrode, said third transistor control electrode being coupled to said high speed semi-dynamic flip-flop circuit first node, said third transistor second flow electrode being coupled to said high speed semi-dynamic flip-flop circuit OUT terminal;

a first inverter, said first inverter comprising a first inverter input and a first inverter output, said first inverter input being coupled to said first clock signal;

a second inverter, said second inverter comprising a second inverter input and a second inverter output, said second inverter input being coupled to said first inverter output;

a NAND gate, said NAND gate comprising a NAND gate first input, a NAND gate second input, and a NAND gate output, said NAND gate first input being coupled to said second inverter output, said NAND gate second input being coupled to said high speed semi-dynamic flip-flop circuit first node, said NAND gate output being coupled to said second transistor control electrode;

a fourth transistor, and said fourth transistor being a NFET transistor and comprising a fourth transistor first flow electrode, a fourth transistor second flow electrode and a fourth transistor control electrode, said fourth transistor first flow electrode being coupled to said high speed semi-dynamic flip-flop circuit first node, said fourth transistor control electrode being coupled to said NAND gate output;

a fifth transistor, said fifth transistor being a NFET transistor and comprising a fifth transistor first flow electrode, a fifth transistor second flow electrode and a fifth transistor control electrode, said fifth transistor first flow electrode being coupled to said fourth transistor second flow electrode, said fifth transistor control electrode being coupled to said high speed semi-dynamic flip-flop circuit data input terminal;

a sixth transistor, said sixth transistor being a NFET transistor and comprising a sixth transistor first flow electrode, a sixth transistor second flow electrode and a sixth transistor control electrode, said sixth transistor first flow electrode being coupled to said fifth transistor second flow electrode, said sixth transistor control electrode being coupled to said first clock signal, said sixth transistor second flow electrode being coupled to said second supply voltage;

a seventh transistor, said seventh transistor being a NFET transistor and comprising a seventh transistor first flow electrode, a seventh transistor second flow electrode and a seventh transistor control electrode, said seventh transistor first flow electrode being coupled to said high speed semi-dynamic flip-flop circuit OUT terminal, said seventh transistor control electrode control being coupled to said first clock signal;

an eighth transistor, said eighth transistor being a NFET transistor and comprising an eighth transistor first flow electrode, an eighth transistor second flow electrode and an eighth transistor control electrode, said eighth transistor first flow electrode being coupled to said seventh transistor second flow electrode, said eighth transistor control electrode being coupled to said high speed semi-dynamic flip-flop circuit first node, said eighth transistor second flow electrode being coupled to said second supply voltage;

a third inverter, said third inverter comprising a third inverter input and a third inverter output, said third inverter input being coupled to said high speed semi-dynamic flip-flop circuit OUT terminal, said third inverter output being coupled to said high speed semi-dynamic flip-flop circuit qbar out terminal;

a fourth inverter, said fourth inverter comprising a fourth inverter input and a fourth inverter output, said fourth inverter input being coupled to said high speed semi-dynamic flip-flop circuit OUT terminal; and a fifth inverter, said fifth inverter comprising a fifth inverter input and a fifth inverter output, said fifth inverter input being coupled to said fourth inverter output, said fifth inverter output being coupled to said high speed semi-dynamic flip-flop circuit OUT terminal.

7. A method for increasing the speed of semi-dynamic flip-flop circuits comprising:

supplying a first supply voltage;

supplying a second supply voltage;

supplying a first clock signal;

providing a high-speed semi-dynamic flip-flop circuit first node;

providing a high-speed semi-dynamic flip-flop circuit OUT terminal;

providing a high-speed semi-dynamic flip-flop circuit data input terminal;

providing a high-speed semi-dynamic flip-flop circuit qbar out terminal;

providing a first transistor, said first transistor comprising a first transistor first flow electrode, a first transistor second flow electrode and a first transistor control electrode;

coupling said first supply voltage to said first transistor first flow electrode;

coupling said first clock signal to said first transistor control electrode;

coupling said first transistor second flow electrode to said high-speed semi-dynamic flip-flop circuit first node;

providing a second transistor, said second transistor comprising a second transistor first flow electrode, a second transistor second flow electrode and a second transistor control electrode;

coupling said first supply voltage to said second transistor first flow electrode;

coupling said second transistor second flow electrode to said high-speed semi-dynamic flip-flop circuit first node;

providing a third transistor, said third transistor comprising a third transistor first flow electrode, a third transistor second flow electrode and a third transistor control electrode;

coupling said first supply voltage to said third transistor first flow electrode;

coupling said third transistor control electrode to said high-speed semi-dynamic flip-flop circuit first node;

coupling said third transistor second flow electrode to said high-speed semi-dynamic flip-flop circuit OUT terminal;

providing a delay circuit, comprising a delay circuit input and a delay circuit output;

coupling said delay circuit input to said first clock signal;

providing a NAND gate, said NAND gate comprising a NAND gate first input, a NAND gate second input, and a NAND gate output;

coupling said NAND gate first input to said delay circuit output;

coupling said NAND gate second input to said high-speed semi-dynamic flip-flop circuit first node;

coupling said NAND gate output to said second transistor control electrode;

providing a fourth transistor, said fourth transistor comprising a fourth transistor first flow electrode, a fourth transistor second flow electrode and a fourth transistor control electrode;

coupling said fourth transistor first flow electrode to said high-speed semi-dynamic flip-flop circuit first node;
coupling said fourth transistor control electrode to said NAND gate output;
providing a fifth transistor, said fifth transistor comprising a fifth transistor first flow electrode, a fifth transistor second flow electrode and a fifth transistor control electrode;
coupling said fifth transistor first flow electrode to said fourth transistor second flow electrode;
coupling said fifth transistor control electrode to said high speed semi-dynamic flip-flop circuit data input terminal;
providing a sixth transistor, said sixth transistor comprising a sixth transistor first flow electrode, a sixth transistor second flow electrode and a sixth transistor control electrode;
coupling said sixth transistor first flow electrode to said fifth transistor second flow electrode;
coupling said sixth transistor control electrode to said first clock signal;
coupling said sixth transistor second flow electrode to said second supply voltage;
providing a seventh transistor, said seventh transistor comprising a seventh transistor first flow electrode, a seventh transistor second flow electrode and a seventh transistor control electrode;
coupling said seventh transistor first flow electrode to said high-speed semi-dynamic flip-flop circuit OUT terminal;
coupling said seventh transistor control electrode control to said first clock signal;
providing an eighth transistor, said eighth transistor comprising an eighth transistor first flow electrode, an eighth transistor second flow electrode and an eighth transistor control electrode;
coupling said eighth transistor first flow electrode to said seventh transistor second flow electrode;
coupling said eighth transistor control electrode to said high-speed semi-dynamic flip-flop circuit first node;
coupling said eighth transistor second flow electrode being coupled to said second supply voltage;
providing a third inverter, said third inverter comprising a third inverter input and a third inverter output;
coupling said third inverter input to said high-speed semi-dynamic flip-flop circuit OUT terminal;
coupling said third inverter output to said high-speed semi-dynamic flip-flop circuit qbar out terminal;
providing a fourth inverter, said fourth inverter comprising a fourth inverter input and a fourth inverter output;
coupling said fourth inverter input to said high-speed semi-dynamic flip-flop circuit OUT terminal;
providing a fifth inverter, said fifth inverter comprising a fifth inverter input and a fifth inverter output;
coupling said fifth inverter input being to said fourth inverter output; and
coupling said fifth inverter output to said high-speed semi-dynamic flip-flop circuit OUT terminal.

8. The method for increasing the speed of semi-dynamic flip-flop circuits of claim 7, wherein, said providing a delay circuit comprises:
providing a first inverter, said first inverter comprising a first inverter input and a first inverter output;
coupling said first inverter input to said first clock signal;
providing a second inverter, said second inverter comprising a second inverter input and a second inverter output;
coupling said second inverter input to said first inverter output.

9. The method for increasing the speed of semi-dynamic flip-flop circuits of claim 8, wherein,
said first supply voltage is Vdd and said second supply voltage is ground.

10. The method for increasing the speed of semi-dynamic flip-flop circuits of claim 9, wherein,
said first, second and third transistors are PFET transistors.

11. The method for increasing the speed of semi-dynamic flip-flop circuits of claim 9, wherein,
said fourth, fifth, sixth, seventh and eighth transistors are NFET transistors.

12. A method for increasing the speed of semi-dynamic flip-flop circuits comprising:
supplying a first supply voltage;
supplying a second supply voltage;
supplying a first clock signal;
providing a high-speed semi-dynamic flip-flop circuit first node;
providing a high-speed semi-dynamic flip-flop circuit OUT terminal;
providing high-speed semi-dynamic flip-flop circuit data input terminal;
providing a high-speed semi-dynamic flip-flop circuit qbar out terminal;
providing a first transistor, said first transistor being a PFET transistor and comprising a first transistor first flow electrode, a first transistor second flow electrode and a first transistor control electrode;
coupling said first supply voltage to said first transistor first flow electrode;
coupling said first clock signal to said first transistor control electrode;
coupling said first transistor second flow electrode to said high-speed semi-dynamic flip-flop circuit first node;
providing a second transistor, said second transistor being a PFET transistor and comprising a second transistor first flow electrode, a second transistor second flow electrode and a second transistor control electrode;
coupling said first supply voltage to said second transistor first flow electrode;
coupling said second transistor second flow electrode to said high-speed semi-dynamic flip-flop circuit first node;
providing a third transistor, said third transistor being a PFET transistor and comprising a third transistor first flow electrode, a third transistor second flow electrode and a third transistor control electrode;
coupling said first supply voltage to said third transistor first flow electrode;
coupling said third transistor control electrode to said high-speed semi-dynamic flip-flop circuit first node;
coupling said third transistor second flow electrode to said high-speed semi-dynamic flip-flop circuit OUT terminal;
providing a first inverter, said first inverter comprising a first inverter input and a first inverter output;
coupling said first inverter input to said first clock signal;
providing a second inverter, said second inverter comprising a second inverter input and a second inverter output;
coupling said second inverter input to said first inverter output;

providing a NAND gate, said NAND gate comprising a NAND gate first input, a NAND gate second input, and a NAND gate output;

coupling said NAND gate first input to said second inverter output;

coupling said NAND gate second input to said high-speed semi-dynamic flip-flop circuit first node;

coupling said NAND gate output to said second transistor control electrode;

providing a fourth transistor, said fourth transistor being a NFET transistor and comprising a fourth transistor first flow electrode, a fourth transistor second flow electrode and a fourth transistor control electrode;

coupling said fourth transistor first flow electrode to said high-speed semi-dynamic flip-flop circuit first node;

coupling said fourth transistor control electrode to said NAND gate output;

providing a fifth transistor, said fifth transistor being a NFET transistor and comprising a fifth transistor first flow electrode, a fifth transistor second flow electrode and a fifth transistor control electrode;

coupling said fifth transistor first flow electrode to said fourth transistor second flow electrode;

coupling said fifth transistor control electrode to said high speed semi-dynamic flip-flop circuit data input terminal;

providing a sixth transistor, said sixth transistor being a NFET transistor and comprising a sixth transistor first flow electrode, a sixth transistor second flow electrode and a sixth transistor control electrode;

coupling said sixth transistor first flow electrode to said fifth transistor second flow electrode;

coupling said sixth transistor control electrode to said first clock signal;

coupling said sixth transistor second flow electrode to said second supply voltage;

providing a seventh transistor, said seventh transistor being a NFET transistor and comprising a seventh transistor first flow electrode, a seventh transistor second flow electrode and a seventh transistor control electrode;

coupling said seventh transistor first flow electrode to said high-speed semi-dynamic flip-flop circuit OUT terminal;

coupling said seventh transistor control electrode control to said first clock signal;

providing an eighth transistor, said eighth transistor being a NFET transistor and comprising an eighth transistor first flow electrode, an eighth transistor second flow electrode and an eighth transistor control electrode;

coupling said eighth transistor first flow electrode to said seventh transistor second flow electrode;

coupling said eighth transistor control electrode to said high-speed semi-dynamic flip-flop circuit first node;

coupling said eighth transistor second flow electrode being coupled to said second supply voltage;

providing a third inverter, said third inverter comprising a third inverter input and a third inverter output;

coupling said third inverter input to said high-speed semi-dynamic flip-flop circuit OUT terminal;

coupling said third inverter output to said high-speed semi-dynamic flip-flop circuit qbar out terminal;

providing a fourth inverter, said fourth inverter comprising a fourth inverter input and a fourth inverter output;

coupling said fourth inverter input to said high-speed semi-dynamic flip-flop circuit OUT terminal;

providing a fifth inverter, said fifth inverter comprising a fifth inverter input and a fifth inverter output;

coupling said fifth inverter input being to said fourth inverter output; and coupling said fifth inverter output to said high-speed semi-dynamic flip-flop circuit OUT terminal.

* * * * *